(12) United States Patent
Beer et al.

(10) Patent No.: US 6,670,665 B2
(45) Date of Patent: Dec. 30, 2003

(54) MEMORY MODULE WITH IMPROVED ELECTRICAL PROPERTIES

(75) Inventors: Peter Beer, Tutzing (DE); Carsten Ohlhoff, München (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/360,456

(22) Filed: Feb. 6, 2003

(65) Prior Publication Data

US 2003/0146461 A1 Aug. 7, 2003

(30) Foreign Application Priority Data

Feb. 6, 2002 (DE) .......................... 102 04 688

(51) Int. Cl.⁷ ............................................ H01L 31/119
(52) U.S. Cl. ........................ 257/296; 257/296; 257/301
(58) Field of Search ................................ 257/296, 301, 257/303, 311, 318; 365/189, 221, 210

(56) References Cited

U.S. PATENT DOCUMENTS

| | | | | |
|---|---|---|---|---|
| 4,675,848 A | * | 6/1987 | Karp et al. | ........... 365/189 |
| 5,383,160 A | * | 1/1995 | Furuyama | ........... 365/221 |
| 5,410,509 A | | 4/1995 | Morita | |
| 6,246,622 B1 | * | 6/2001 | Sugibayashi | ............ 365/210 |

FOREIGN PATENT DOCUMENTS

DE      197 03 611 A1     8/1998

* cited by examiner

*Primary Examiner*—David Nelms
*Assistant Examiner*—Thinh T. Nguyen
(74) *Attorney, Agent, or Firm*—Laurence A. Greenberg; Werner H. Stemer; Gregory L. Mayback

(57) ABSTRACT

A memory module, in particular a DRAM, has a memory cell array with memory cells disposed in a matrix form. Dummy memory cells are formed in an edge region of the memory cell array, which dummy memory cells are not used for storing items of information. First electrodes of the dummy memory cells are connected to a reference potential. A counter electrode of the dummy memory cells is electrically connected to the counter electrode of the memory cells. A charge capacitance of the counter electrode of the memory cells is increased in this way. Consequently, there is an overall increase in the voltage stability of the memory module with respect to a large entry of charge into the memory cells.

10 Claims, 4 Drawing Sheets

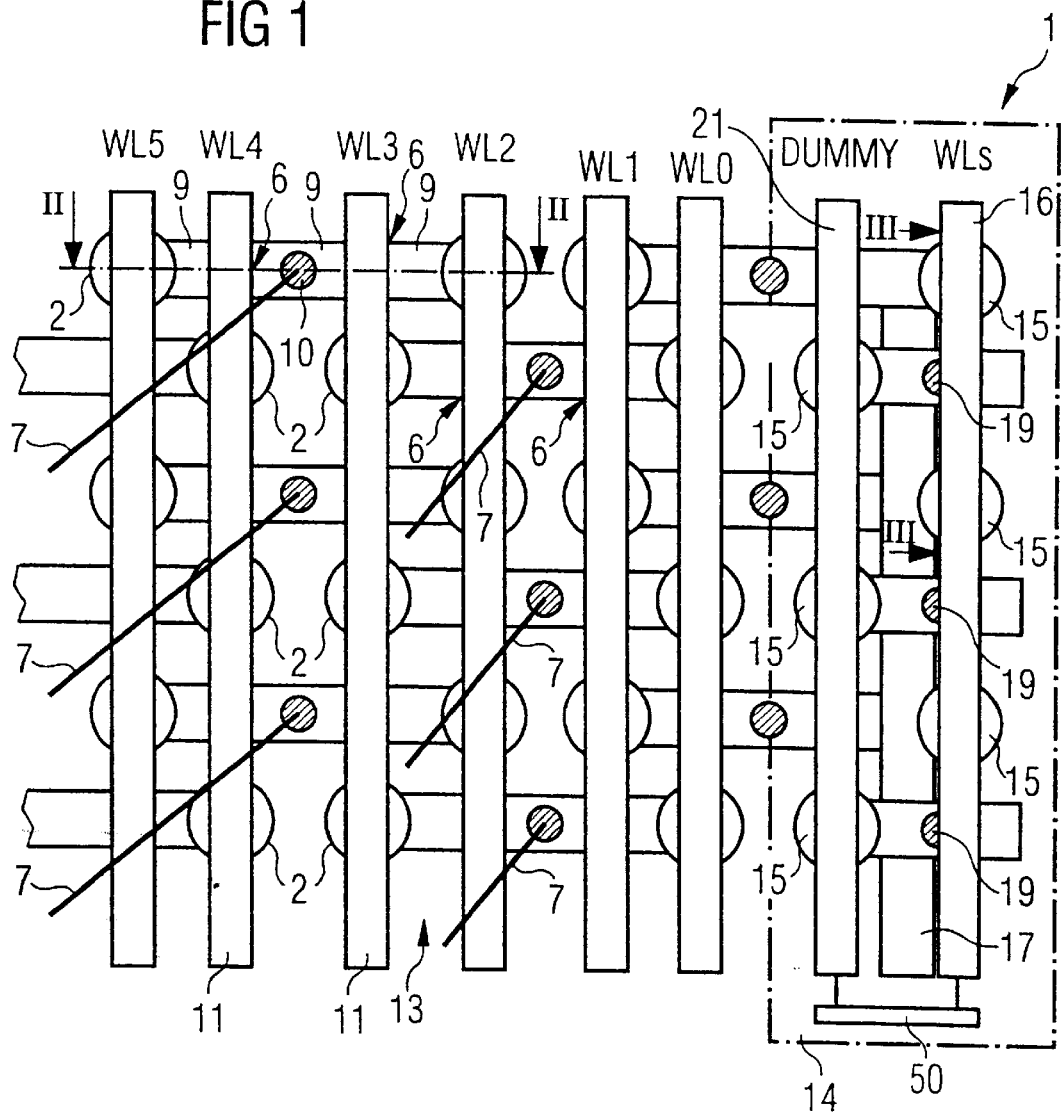

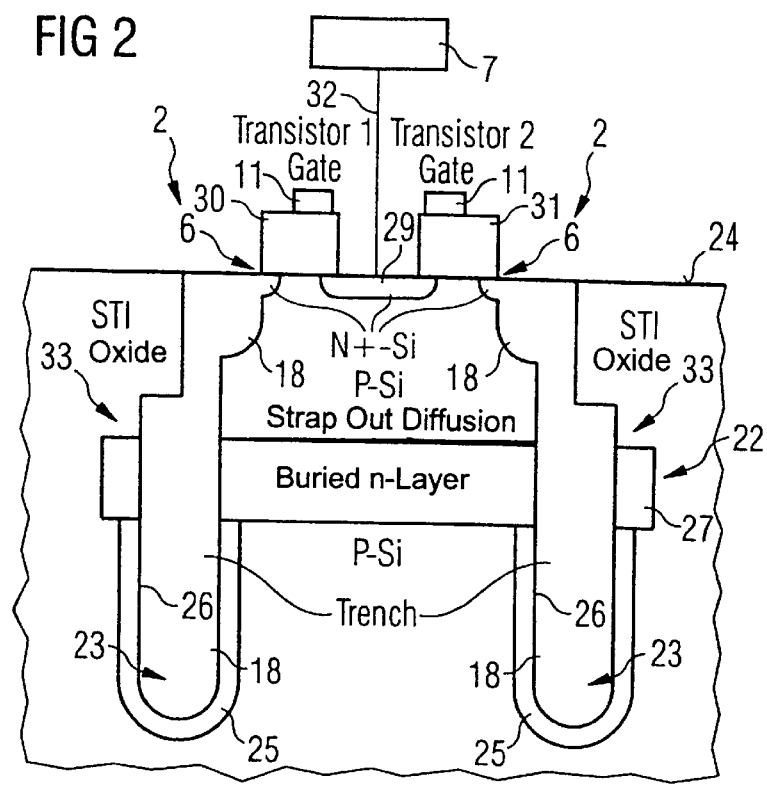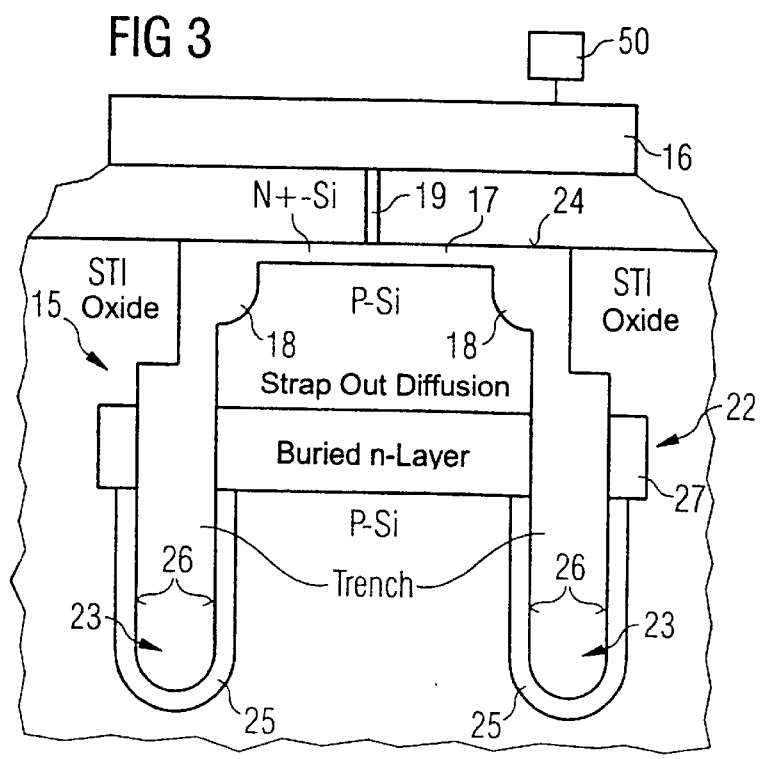

MEMORY MODULE WITH IMPROVED ELECTRICAL PROPERTIES

BACKGROUND OF THE INVENTION

Field of the Invention

The invention relates to a memory module, in particular a semiconductor memory. The memory module has a substrate, in which memory cells are formed. The memory cells each have a capacitor and a selection transistor. A memory cell is connectable to a bit line through the selection transistor. Word lines are provided, by which the selection transistors can be switched in order to read out and/or write in an item of information stored in the memory cell via the bit line. The capacitor has a first electrode and a counter electrode, the counter electrode being formed as an electrically conductive region in the substrate. The first electrode is electrically conductively connected to the selection transistor. The memory cells are provided for storing and outputting items of information and are disposed in an active region of the substrate. Dummy memory cells are formed in a manner adjoining the active region. The dummy memory cells are not used for storing items of information. A dummy memory cell has a first electrode and a counter electrode, the counter electrode is formed as an electrically conductive region in the substrate. The counter electrode is connectable to a voltage potential.

Semiconductor memories are used for example as dynamic semiconductor memories (DRAMs) in order to enable fast and cost-effective storage of items of information. The further development in the case of semiconductor memories leads, in the case of new memory generations, to ever shorter activation times of the word lines (row cycle time), ever longer word line lengths and an increase in the parallelism in the case of read accesses. This is manifested particularly in the case of prefetch instructions of a double data rate DRAM. If the content of a DRAM is rewritten, this results in that the charge is changed in the capacitors of the memory cells situated in parallel in the substrate of the memory. If the sign of a change in charge is not statistically distributed, rather the same voltage is written to the majority of the memory cell capacitors, then the result is a significant entry of charge into the counter electrode of the memory cells, which is formed in the substrate. The overall result is an alteration of the voltage in the counter electrode. This change in voltage must be compensated for as a displacement current from the on-chip voltage supply network. The magnitude of the displacement current is proportional to the charge of the memory cell capacitors that is rewritten per unit time.

The facts described mean that it is becoming increasingly difficult to stabilize the potential of the counter electrode. The electrical connection between the counter electrode and a voltage generator, which is intended to stabilize the network of the counter electrode, is formed in the form of metal tracks and well contacts. The metal tracks and well contacts have a non-negligible electrical resistance. As a result, even with an adequately dimensioned voltage generator, the charge required for the voltage compensation is not immediately supplied into the counter electrode. However, an unstable potential of the counter electrode leads to shifts in the signal distance between the voltage charged in the capacitor of a memory cell and the voltage of the counter electrode.

SUMMARY OF THE INVENTION

It is accordingly an object of the invention to provide a memory module with improved electrical properties which overcomes the above-mentioned disadvantages of the prior art devices of this general type, which has improved stabilization of the voltage potential of the counter electrode of a memory module.

With the foregoing and other objects in view there is provided, in accordance with the invention, a memory module.

The memory module contains a substrate having an active region, a voltage generator outputting a reference potential, and memory cells formed in the substrate and having capacitors and selection transistors. Each of the capacitors has a first electrode and a second electrode being a counter electrode, and the counter electrode is an electrically conductive region disposed in the substrate. The first electrode is electrically conductively connected to a respective one of the selection transistors. The memory cells store and output items of information and are disposed in the active region of the substrate. Dummy memory cells are disposed adjoining the active region, the dummy memory cells are not used for storing items of information. Each of the dummy memory cells has a first dummy electrode and a second dummy electrode being a counter dummy electrode. The counter dummy electrode is an electrically conductive region disposed in the substrate. The counter dummy electrode is connectable to a voltage potential. The first dummy electrode is electrically conductively connected to the voltage generator outputting the reference potential. Bit lines are connected to the selection transistors for accessing the memory cells. Word lines are connected to and drive the selection transistors for reading out and/or writing in the items of information stored in the memory cells through the bit lines.

An essential advantage of the invention is that the electrical capacitance of dummy memory cells is used to increase the capacitance of the counter electrode. Dummy memory cells are provided in a multiplicity of embodiments of memory modules in order to form symmetrically boundary regions of the configuration of the memory cells as far as possible identically with inner regions of the configuration of the memory cells. Hitherto, the first electrodes of the dummy memory cells have not been connected to a fixed potential, but rather have been floating. In the memory module according to the invention, in contrast, the first electrodes of the dummy memory cells are electrically conductively connected to a voltage potential (e.g. GND). As a result, an electrical capacitance that is already present on the memory module is coupled to the counter electrode and the total capacitance of the counter electrode is thus increased. As a result, the counter electrode becomes less sensitive overall with respect to excessively large entries of charge, since, with an increased capacitance, even relatively large entries of charge can be compensated for without excessively large changes in voltage.

In one preferred embodiment, dummy word lines are disposed above the dummy memory cells, which dummy word lines are preferably electrically conductively connected to the first electrodes of the dummy memory cells and to a voltage potential or network (e.g. GND). Consequently, besides the capacitance of the dummy memory cell, at the same time the capacitance of the dummy word line is utilized as an additional capacitance for the counter electrode. Consequently, the capacitance of the counter electrode is increased still further without having to carry out significant changes in the layout in comparison with previous customary configurations of dummy memory cells.

In a further advantageous embodiment, the first electrodes of the dummy memory cells are electrically conductively connected to one another, and are electrically conductively connected to a voltage potential or network (e.g. GND), via an electrically conductive track that is introduced into the substrate. Consequently, a further embodiment is provided which enables a simple and cost-effective connection of the first electrodes of the dummy memory cells to the voltage network. In this embodiment, the capacitance of the counter electrode is additionally increased not only by the capacitance of the dummy memory cells but also by the capacitance of the electrically conductive track. This embodiment has the disadvantage that an additional electrically conductive track has to be introduced into the substrate. However, this embodiment has the advantage that the capacitance of the counter electrode not only increases through the capacitances of the dummy memory cells, but also increases through the capacitance of the electrically conductive track. Consequently, overall an additional increase in the capacitance of the counter electrode is achieved.

A further improvement of the memory module is achieved by virtue of the fact that further dummy memory cells whose first electrodes are floating, i.e. electrically insulated, are disposed in a manner adjoining dummy memory cells which are electrically conductively connected to the voltage network. What is achieved by this embodiment is that even when the dummy memory cells are connected to the voltage network, the edge regions of the dummy memory cells are situated in an environment similar to inner regions of the memory cell configuration. In this way, dummy memory cells that are electrically conductively connected to the voltage network are at least partly shielded from disturbing edge effects. Consequently, an entry of disturbing effects via the dummy memory cells into the counter electrode is largely avoided.

In a further preferred embodiment, further dummy memory cells whose first electrodes are electrically insulated are disposed between the memory cells and the dummy memory cells. This embodiment has the advantage that the layout that has been customary hitherto only has to be supplemented and there is no need to change the previous method.

In accordance with an added feature of the invention, an electrically conductive track structure is disposed in the substrate and has a longitudinal track. The longitudinal track is disposed parallel to the dummy word lines and the word lines. The electrically conductive track structure has transverse tracks disposed perpendicularly to the longitudinal track, and the transverse tracks are electrically conductively connected to the longitudinal track. The further dummy memory cells are disposed in a same grid as the dummy memory cells, and the further dummy memory cells have first further electrodes electrically conductively connected to one another through the electrically conductive track structure. Each of the transverse tracks are electrically conductively connected to the first dummy electrodes of in each case two of the further dummy memory cells of the active region. The further dummy memory cells are disposed remote from the longitudinal track, and the electrically conductive track structure is electrically conductively connected to the voltage generator.

In accordance with a further feature of the invention, a conductive layer is disposed in the substrate. In each case two of the first dummy electrodes of two of the dummy memory cells are electrically conductively connected to one another through the conductive layer. In addition, an electrically conductive contact is connected to the dummy word line and is disposed directly above the conductive layer.

Other features which are considered as characteristic for the invention are set forth in the appended claims.

Although the invention is illustrated and described herein as embodied in a memory module with improved electrical properties, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, plan view of a first embodiment of a memory cell configuration according to the invention;

FIG. 2 is a diagrammatic, cross-sectional view, taken along the line II—II shown in FIG. 1, through two memory cells and word lines;

FIG. 3 is a cross-sectional view, taken along the line III—III shown in FIG. 1, through two dummy memory cells and a dummy word line;

DESCRIPTION OF THE PREFERRED EMBODIMENTS

Figure 4:
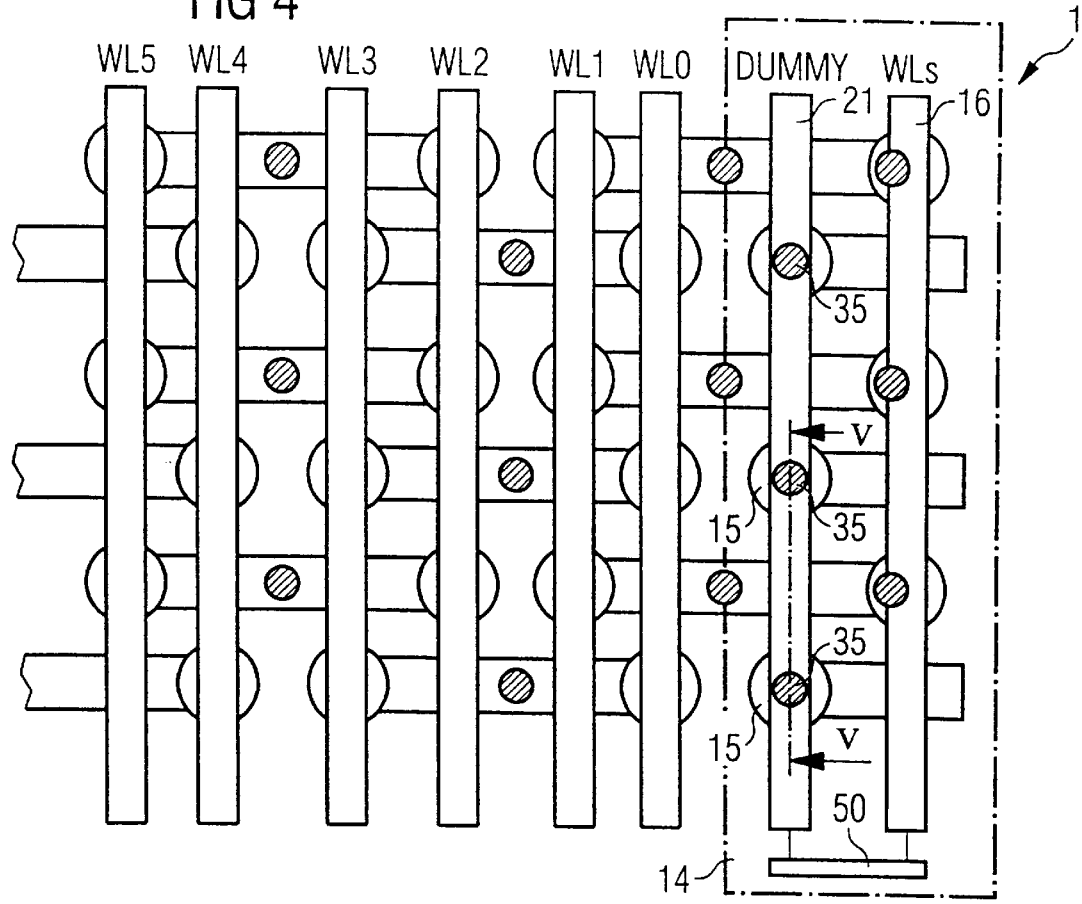
FIG. 4 is a plan view of a layout of a second memory cell configuration.

The invention is described below on the basis of a DRAM semiconductor memory, but the invention can be applied to any type of memory module.

Referring now to the figures of the drawing in detail and first, particularly, to FIG. 1 thereof, there is shown a schematic detail from a memory cell array of a memory module, which is formed as a DRAM semiconductor memory in this exemplary embodiment. A memory module has a memory cell array 1 with memory cells 2 disposed in matrix form. Each memory cell 2 is electrically conductively connected to a bit line 7 via a selection transistor 6. The bit lines 7 are connected via amplifier circuits to an input/output circuit via which data can be read from the memory cells 2 or written to the memory cells 2. Word lines 11 are provided, by which a series of selection transistors 6 can be switched into an on state. Furthermore, column lines are provided, which are connected to a series of second selection transistors and can switch the second selection transistors into an on state. The word lines and the row lines are disposed in such a way that when a word line is activated, a multiplicity of bit lines are electrically conductively connected to the associated memory cells. By the selection of a column line, one of the bit lines is selected from the activated bit lines and is electrically conductively connected to the input/output circuit. Consequently, each memory cell can be individually selected for reading in or reading out items of information and be electrically conductively connected to the input/output circuit.

FIG. 1 shows a plan view of the memory cell array 1 with the multiplicity of memory cells 2. In the embodiment chosen, in each case two memory cells 2 can be electrically conductively connected to a terminal point 10 via an active region 9 and two selection transistors 6. The active region 9 essentially has a straight track structure 9. The word lines 11 are provided perpendicular to the configuration of the active region 9. The word lines 11 are routed alternately from top to bottom in each case between the memory cell 2 and the terminal point 10 and over the memory cell 2. In the region in which the word line 11 is routed over an active region 9, the word line 11 serves for switching the selection transistor 6 disposed below the word line 11 and in the active region 9. The corresponding activation of one of the two word lines 11, which is activated between a common terminal point 10 and the two adjacent memory cells 2, selects which memory cell 2 is to be connected via the common terminal point 10 to the bit line 7 which is electrically conductively connected to the terminal point 10.

The memory cell array 1 illustrated is subdivided into an active region 13 and a dummy region 14. Memory cells for storing items of information are provided in the active region 13. In the dummy region 14, which generally adjoins the active region 13 in a lateral edge region, dummy memory cells 15 are provided, which do not serve for storing items of information.

In the selected exemplary embodiment of FIG. 1, first and second dummy word lines 16, 21 are disposed above the dummy memory cells 15. The dummy memory cells 15 are disposed in the same grid as the memory cells 2. The dummy word lines 16, 21 are disposed in the same grid as the word lines 11. In addition to the active regions 9, there is provided in the dummy region 14 a conductive layer 17 that electrically connects first electrodes 18 of the dummy memory cells 15 to one another. The conductive layer 17 is preferably formed parallel to the dummy word lines 16, 21. In the regions in which the first dummy word line 16 is routed over the active region 9, the first dummy word line 16 is electrically conductively connected to the active region 9 via a terminal connection 19. The first and second dummy word lines 16, 21 are connected to a voltage generator 50, which applies a defined potential to the first electrodes 18. The capacitance of the counter electrode is increased in this way. In the selected example of FIG. 1, the second dummy word line 21 which directly adjoins the active region 13 is used neither for driving the selection transistors 6 nor for electrically conductively connecting the dummy memory cells 15. In the embodiment of the first FIG. 1, the second dummy word line 21 is connected to a ground potential. However, the dummy memory cells 15 disposed below the second dummy word line 21 are not connected to the ground potential.

FIG. 2 shows a diagrammatic cross-section view, taken along the line II—II shown in FIG. 1, through two memory cells 2 of the common active region 9 of the active region 13. A substrate 22 is provided, which essentially contains a p-doped silicon substrate in this exemplary embodiment. Trenches 23 are introduced into the silicon substrate 22, the trenches 23 are filled with a highly n-doped silicon material up to the substrate surface 24. In a lower region, the trench 23 is surrounded by an n-doped cladding layer 25. The n-doped silicon material of the trench 23 and the cladding layer 25 are electrically insulated from one another by a dielectric layer 26. In an upper end region, the cladding layer 25 is led to a buried layer 27, which is likewise n-doped. The buried layer 27 and the cladding layer 25 constitute the counter electrode of storage capacitors 33. The filling of the trench 23 constitutes a first electrode 18 and the cladding layer 25 with the buried layer 27 constitute a second electrode, i.e. the counter electrode, of the capacitor 33 of the memory cell 2.

Between the two first electrodes 18 of the two memory cells 2, a negatively doped bit line region 29 is introduced in the region of the substrate surface 24. A first and a second gate contact 30, 31 are applied between the bit line region 29 and the spaced-apart upper regions of the first electrodes 18 of the two memory cells 2. The bit line region 29 is electrically conductively connected to the bit line 7 via a line connection 32. The first and second gate contacts 30, 31 are electrically conductively connected to a first and second word line 11, respectively.

Consequently, the selection transistor 6 is in each case formed between the bit line region 29 and the upper end regions of the first electrodes 18 of the memory cells 2. Depending on the driving of the first or second word line 11, one of the two selection transistors 6 is electrically switched on and, consequently, one of the two first electrodes 18 of two capacitors 33 is electrically conductively connected to the bit line 7.

FIG. 3 shows a cross-sectional view, taken along the line III—III shown in FIG. 1, through two dummy memory cells 15 of different active regions 9. The dummy memory cells 15 are essentially constructed in accordance with the memory cells of FIG. 2, but no selection transistor 6 is provided, rather the active region 9 is electrically conductively connected to the first dummy word line 16 directly via the terminal connection 19. The first dummy word line 16 is again connected to a ground potential. The electrical connection between the upper region of the first electrode 18 of the dummy memory cell 15 and the terminal connection 19 is realized via the conductive layer 17 disposed in the upper region of the substrate 22. The conductive layer 17 is formed as a highly negatively doped silicon layer in this exemplary embodiment.

What is thus achieved by the embodiment of the memory module of FIG. 1 is that the first electrodes 18 of the dummy memory cells 15 are electrically conductively connected to the first dummy word line 16 via the conductive layer 17 and via the terminal connections 19. The first dummy word line 16 is connected to a reference potential provided by the voltage generator 50, preferably to the ground potential. Consequently, the capacitance of the memory cell array 1 is increased overall. As a result, the memory cell array 1 overall is adversely affected to a lesser extent by large entries of charge into the memory cells 2. The increase in the capacitance enables even relatively large entries of charge without a shift in the potential of the counter electrode, represented by the buried layer 27 and the cladding layer 25. Consequently, a memory module with an improved voltage stability is obtained overall.

FIG. 4 shows a further embodiment of a memory module with the memory cell array 1 having the active region 13 and the dummy region 14. In this embodiment, the second dummy word line 21 is additionally electrically conductively connected via second terminal connections 35 to the underlying dummy memory cells 15. Both the first and the second dummy word lines 16, 21 are connected to a reference potential provided by the voltage generator 50, preferably to ground potential. An additional increase in the capacitance of the memory cell array 1 is thus achieved in comparison with the embodiment of FIG. 1. Consequently, the series of dummy memory cells 15 which directly adjoin the active region 13 is also electrically conductively connected to the reference potential via the second dummy word line 21.

Figure 5:
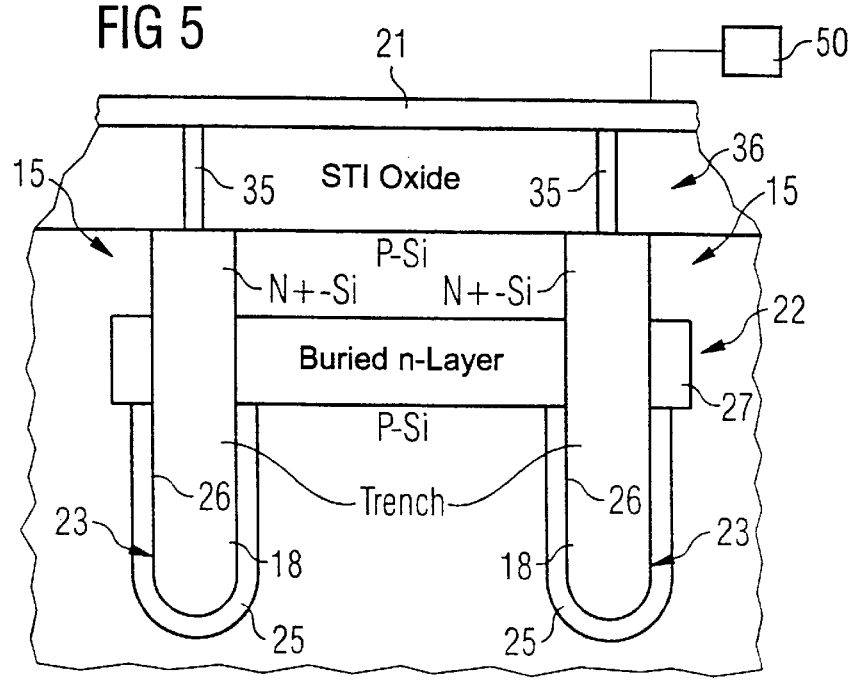
FIG. 5 is a cross-sectional view, taken along the line V—V shown in FIG. 4, through two dummy memory cells.

FIG. 5 shows a cross-sectional view taken along the line V—V shown in FIG. 4 through the memory cell array 1 of two dummy memory cells 15 which are disposed below the second dummy word line 21. The dummy memory cells 15 essentially correspond to the construction of the dummy memory cells of FIG. 3. The dummy memory cells 15 are introduced in the substrate 22. An oxide layer 36 is disposed on the surface of the substrate 22, the second dummy word line 21 bearing on the oxide layer 36. Between the second dummy word line 21 and the dummy memory cells 15, second terminal connections 35 are routed through the oxide layer 36. The second dummy word lines 21 are connected to the reference potential provided by the voltage generator 50.

Figure 6:
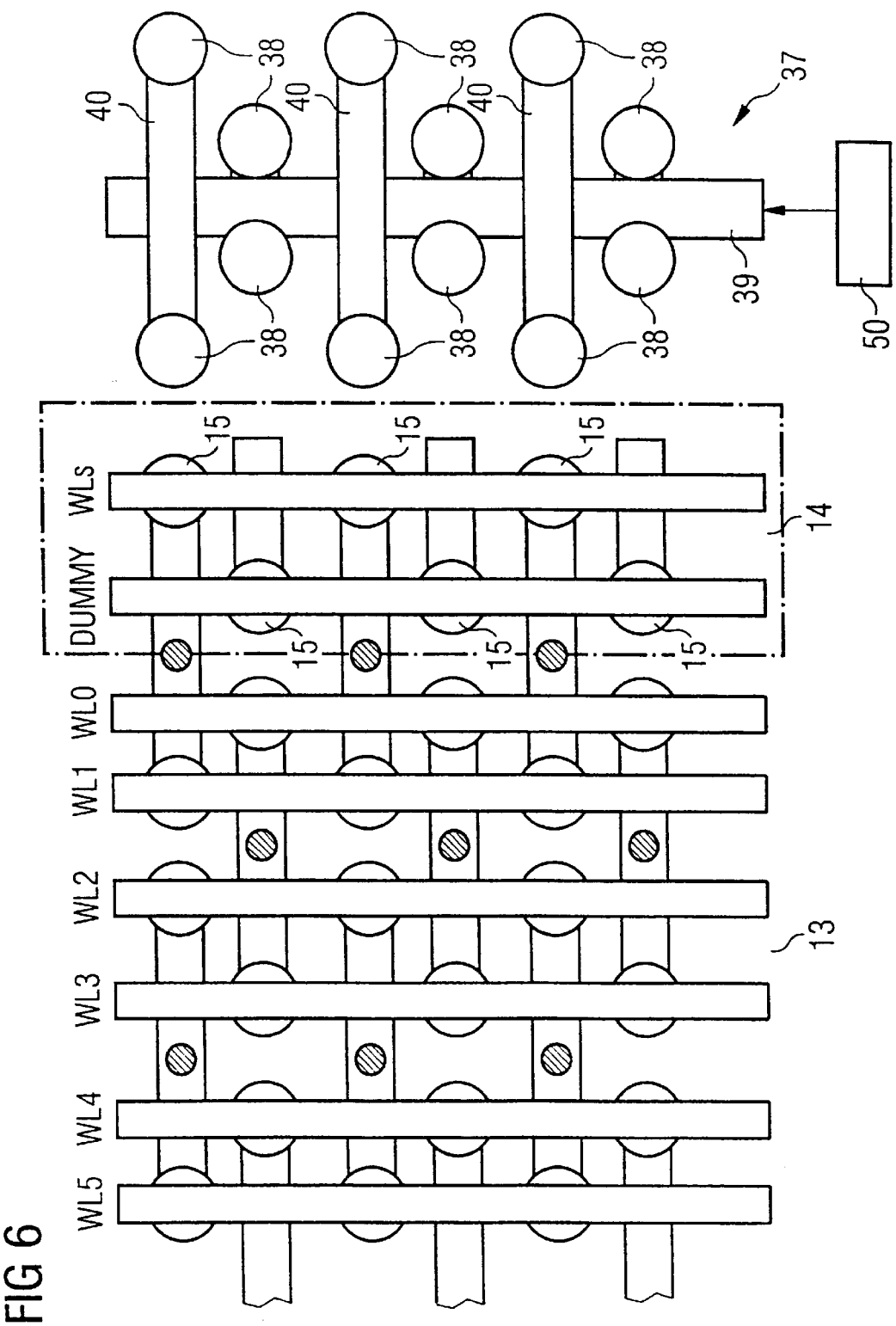
FIG. 6 is a plan view of a third embodiment of a memory cell configuration.

FIG. 6 shows a further embodiment of the memory cell array 1 with the active region 13 and the dummy region 14. The dummy memory cells 15 are disposed in the dummy region 14, the dummy memory cells not being electrically connected to the overlying dummy word lines 16, 21. The first electrodes 18 of the dummy memory cells 15 are electrically insulated from the surroundings. The dummy memory cells 15 are formed in accordance with FIG. 5, but the second terminal connection 35 is absent.

Beside the dummy region 14, a further region 37 is formed along a side edge, further dummy memory cells 38 being disposed in the further region 37. The further dummy memory cells 38 are formed in accordance with the dummy memory cells 15 of FIG. 5. The further dummy memory cells 38 are disposed in the same grid as the memory cells 2 and the dummy memory cells 15. The further dummy memory cells 38 are electrically conductively connected to one another via a track structure 39, 40. The track structure essentially has a longitudinal track 39 disposed parallel to the word lines 11, 16, 21. Transverse tracks 40 are formed perpendicularly to the longitudinal track 39, which transverse tracks in each case connect two further dummy memory cells 38 to one another and put them in electrical contact with the longitudinal track. The longitudinal track 39 is connected to the voltage generator 50, which provides the reference potential for the first electrodes 18 of the further dummy memory cells 38.

The embodiment of FIG. 6 has the advantage that the electrical properties of the memory cells 2 are well shielded from interference effects by the dummy memory cells 15 of the dummy region 14 in the edge region and, moreover, the capacitance of the counter electrode formed by the buried layer 27 has been increased by the further dummy memory cells 38. Consequently, a memory cell array 1 is provided which is well shielded from edge effects and, moreover, enables a relatively good stabilization of the voltage potential of the counter electrode.

The advantageous effect of the memory module according to the invention is achieved even when the first and/or second word line 16, 21 and/or the track structure are connected to a reference potential in a low-impedance manner. In a simple embodiment, the ground potential is used as the reference potential. By linking the first electrodes 18 of the dummy memory cells 15 and/or of the further dummy memory cells 38 to a reference potential which is kept constant through suitable measures, more charge is stored in the counter electrode. The counter electrode of the dummy memory cells 15 and of the further dummy memory cell 38 is electrically conductively connected to the counter electrode of the memory cells 2 of the memory array 1. The buried layers 27 of the memory cells 2 and of the dummy memory cells 15 and/or of the further dummy memory cells 38 are preferably embodied as a contiguous layer. The circuit configuration according to the invention advantageously increases the capacitance of the counter electrode of the memory cells 2 with small measures.

We claim:

1. A memory module, comprising:
   a substrate having an active region;
   a voltage generator outputting a reference potential;
   memory cells formed in said substrate and having capacitors and selection transistors, each of said capacitors having a first electrode and a second electrode being a counter electrode, said counter electrode being an electrically conductive region disposed in said substrate, said first electrode electrically conductively connected to a respective one of said selection transistors, said memory cells storing and outputting items of information and disposed in said active region of said substrate;
   dummy memory cells disposed adjoining said active region, said dummy memory cells not being used for storing the items of information, each of said dummy memory cells having a first dummy electrode and a second dummy electrode being a counter dummy electrode, said counter dummy electrode being an electrically conductive region disposed in said substrate, said counter dummy electrode being connectable to a voltage potential, said first dummy electrode electrically conductively connected to said voltage generator outputting the reference potential;
   bit lines connected to said selection transistors for accessing said memory cells; and
   word lines connected to and driving said selection transistors for reading out and/or writing in the items of information stored in said memory cells through said bit lines.

2. The memory module according to claim 1, further comprising a dummy word line disposed above a series of said dummy memory cells, said dummy word line connected to said first dummy electrode of at least one of said dummy memory cells, and said dummy word line electrically conductively connectable to said voltage generator.

3. The memory module according to claim 1, further comprising an electrically conductive track disposed in said substrate, said electrically conductive track electrically conductively connecting said first dummy electrode of said dummy memory cells to one another.

4. The memory module according to claim 3, wherein said electrically conductive track is connected to said voltage generator.

5. The memory module according to claim 2,
   wherein said dummy word line is one of a plurality of dummy word lines disposed above said dummy memory cells;
   wherein said substrate has a further region; and
   further comprising further dummy memory cells disposed adjoining an outer side of said dummy memory cells, said further dummy memory cells disposed in said further region and have first further electrodes being electrically insulated.

6. The memory module according to claim 2,
   wherein said dummy word line is one of a plurality of dummy word lines disposed above said dummy memory cells;
   wherein said substrate has a further region;
   further comprising further dummy memory cells disposed in said further region adjoining an outer side of said dummy memory cells, said further dummy memory cells are electrically conductively connectable to said voltage generator; and
   wherein said first dummy electrodes are electrically insulated and said dummy memory cells are disposed between said further dummy memory cells and said memory cells.

7. The memory module according to claim 6,
   further comprising an electrically conductive track structure disposed in said substrate and having a longitudinal track, said longitudinal track disposed parallel to said dummy word lines and said word lines, said electrically conductive track structure having transverse tracks disposed perpendicularly to said longitudinal track, said transverse tracks are electrically conductively connected to said longitudinal track; and wherein said further dummy memory cells are disposed in a same grid as said dummy memory cells, said further dummy memory cells having first further electrodes electrically conductively connected to one another through said electrically conductive track structure, each of said transverse tracks electrically conductively connected to said first dummy electrodes of in each case two of said further dummy memory cells of said active region, said further dummy memory cells are disposed remote from said longitudinal track, and said electrically conductive track structure is electrically conductively connected to said voltage generator.

8. The memory module according to claim 2, further comprising:

a conductive layer disposed in said substrate, in each case two of said first dummy electrodes of two of said dummy memory cells are electrically conductively connected to one another through said conductive layer; and an electrically conductive contact connected to said dummy word line and disposed directly above said conductive layer.

9. The memory module according to claim 7, further comprising:

a conductive layer disposed in said substrate, in each case two of said first further electrodes of two of said further dummy memory cells are electrically conductively connected to one another through said conductive layer; and an electrically conductive contact connected to said dummy word line is formed directly above said conductive layer.

10. The memory module according to claim 1, wherein the memory module is a semiconductor memory.

* * * * *